United States Patent
Harmsen

[19]

[11] Patent Number: 6,017,191
[45] Date of Patent: Jan. 25, 2000

[54] AXIAL VENTILATOR HOUSING

[75] Inventor: Siegfried Harmsen, St. Georgen, Germany

[73] Assignee: Papst-Motoren GmbH & Co. KG, Germany

[21] Appl. No.: 08/987,438

[22] Filed: Dec. 9, 1997

[30] Foreign Application Priority Data

Dec. 10, 1996 [DE] Germany ............... 296 21 408 U

[51] Int. Cl.$^7$ .................................................. F01D 1/02
[52] U.S. Cl. .................. 416/247 R; 415/121.2; 415/119; 415/191; 415/195; 415/208.2; 415/210.1; 415/211.2; 415/220; 417/423.14
[58] Field of Search ............. 416/247 R; 415/121.2, 415/119, 191, 195, 208.2, 210.1, 211.2, 220; 417/423.14

[56] References Cited

U.S. PATENT DOCUMENTS

| 4,761,115 | 8/1988 | Hopfensperger . | |
|---|---|---|---|
| 5,259,726 | 11/1993 | Bacria | 415/119 |
| 5,391,056 | 2/1995 | Wang | 416/247 R |
| 5,460,485 | 10/1995 | Sugiyama . | |
| 5,460,571 | 10/1995 | Kato et al. | 454/184 |
| 5,498,130 | 3/1996 | Wakley et al. | 415/213.1 |
| 5,577,888 | 11/1996 | Capdevila et al. | 415/210.1 |
| 5,601,412 | 2/1997 | Vice | 416/247 R |
| 5,695,318 | 12/1997 | Harmsen | 415/218.1 |

FOREIGN PATENT DOCUMENTS

| 237976 | 9/1987 | European Pat. Off. . | |
|---|---|---|---|
| 0387987 | 9/1990 | European Pat. Off. . | |
| 0499166 | 8/1992 | European Pat. Off. . | |
| 547253 | 6/1993 | European Pat. Off. . | |
| 0679053 A2 | 4/1995 | European Pat. Off. . | |
| 3408139 C2 | 9/1985 | Germany . | |
| 3626485 C2 | 2/1988 | Germany . | |
| 9013191 | 3/1992 | Germany | 416/247 R |
| 4234147 A1 | 4/1994 | Germany . | |
| 29519895 U1 | 3/1996 | Germany . | |
| 2 289087 | 11/1995 | United Kingdom . | |

*Primary Examiner*—F. Daniel Lopez
*Assistant Examiner*—Matthew T. Shanley
*Attorney, Agent, or Firm*—Jones & Askew

[57] ABSTRACT

This invention relates to an axial fan housing having a metallic shielding grating covering an air passage opening, wherein the grating is formed with a series of vane-like guide bars arranged in two or more concentric circular series. The number of guide bars in each circular concentric series increases from the radially inner series to the radially outer series of guide bars.

10 Claims, 2 Drawing Sheets

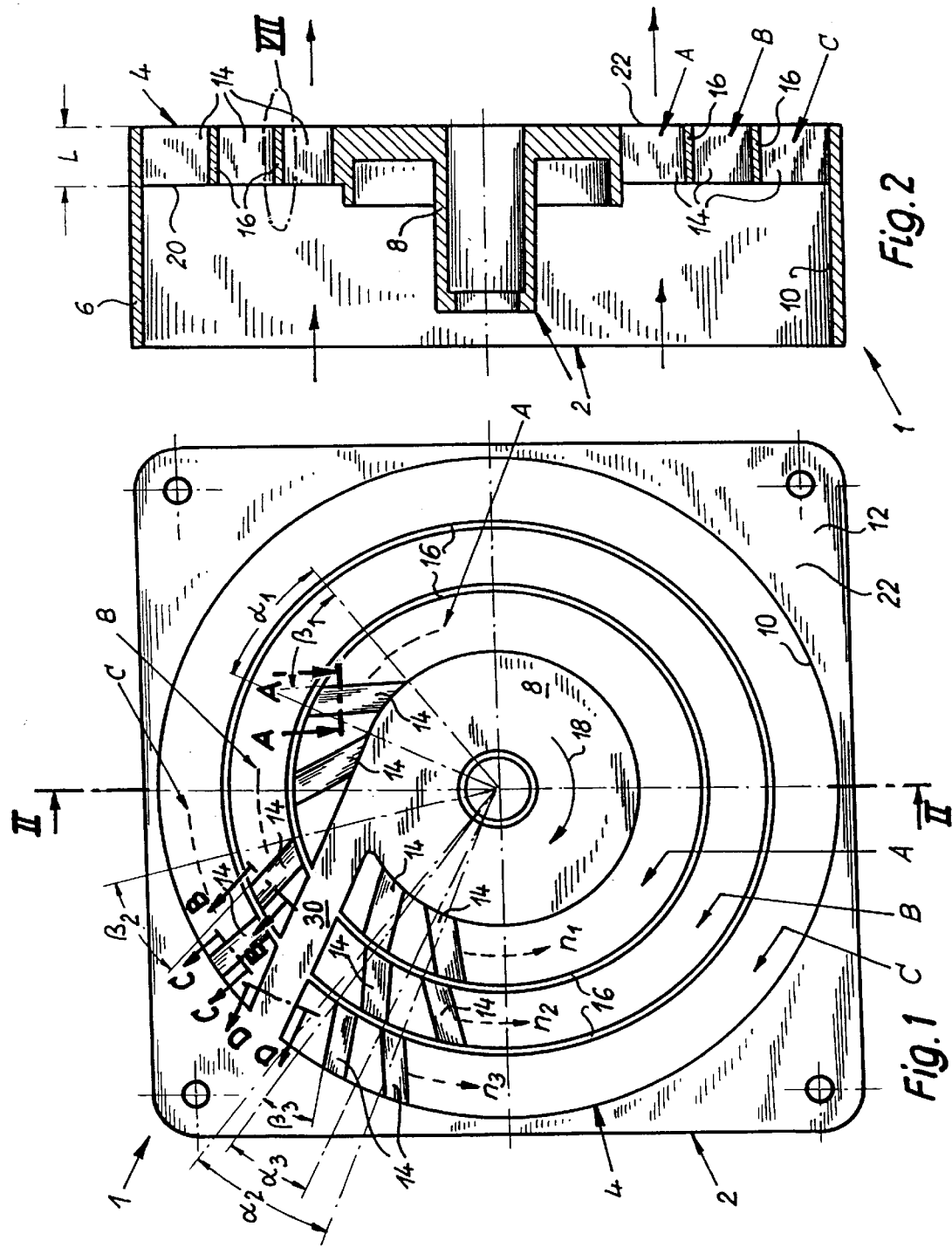

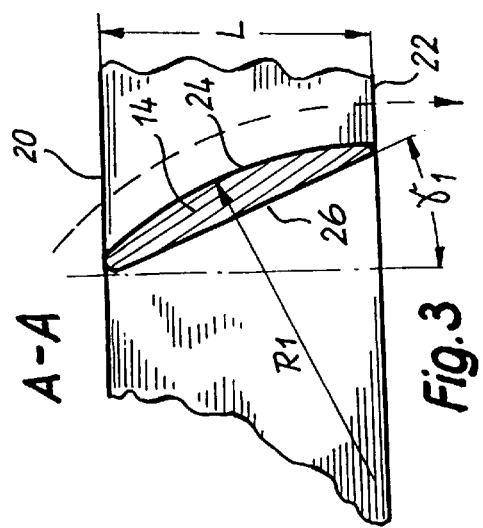
Fig.3 A-A
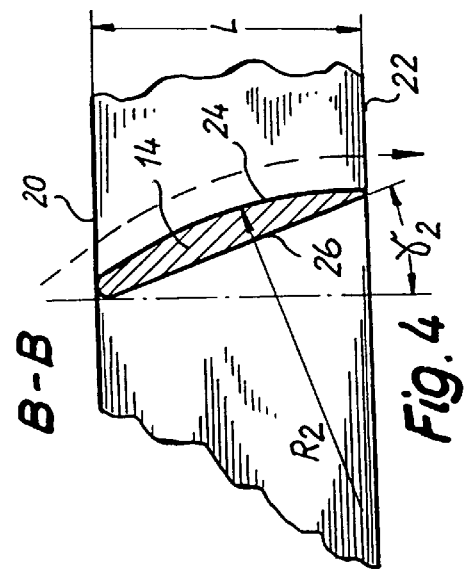
Fig.4 B-B
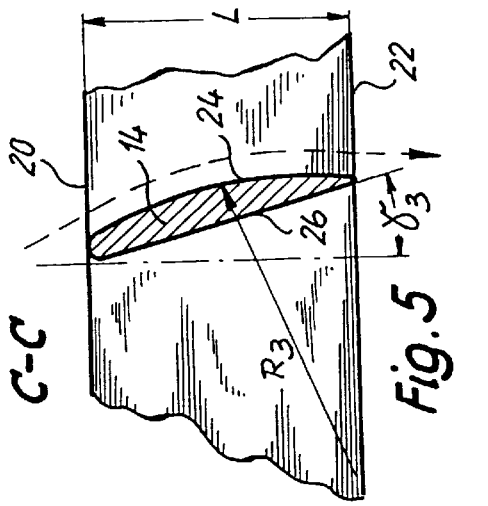
Fig.5 C-C
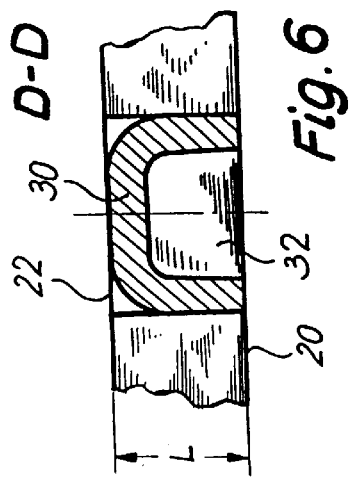
Fig.6 D-D
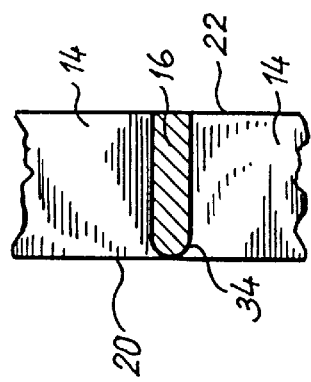
Fig.7

AXIAL VENTILATOR HOUSING

The present invention relates to an axial fan housing which could be used in particular for cooling purposes in EMC-shielded apparatuses, comprising an accommodating part, which has an air passage opening, for an axial fan and a metallic shielding grating which covers the air passage opening.

Utility model DE 295 19 895 U1 describes an "apparatus with components which generate high-frequency radiation and heat during operation". Such apparatuses and the components contained therein, in particular CPUs, must be cooled, for which purpose a fan is usually arranged in the region of an opening in the apparatus wall. For reasons of EMC ( electromagnetic compatibility), it must furthermore be ensured that the "radiation" (or HF waves) generated by these components cannot pass from the apparatus to the outside, or at least can do so in a severely damped form. If necessary, radiation generated outside the apparatus also should not be able to enter the inside in a non-damped form. For this purpose, according to the utility model mentioned, a protective grating of metal having a honeycombed grating structure is provided. Although quite good damping by shielding is achieved by this means, this grating construction causes flow-related noises during operation of the fan, which cause trouble for some uses. Furthermore, quite high pressure losses also arise in this case.

The present invention is based on the object of improving a fan housing of the type mentioned such that a sufficiently good EMC shielding (HF damping), coupled with simultaneously good flow properties—and as a result low noise and a high fan output (low pressure losses)—is achieved. The invention provides an axial flow housing as set out in claim 1.

The guide bars can be designed such that optimum flow properties can be achieved. As a result of arranging the guide bars in distribution in at least two and preferably at least three concentric circular series, the number of guide bars in the individual circular series can in each case increase from the inside outwards. Viewed overall, the guide bars can consequently be arranged in distribution over the area of the air passage opening uniformly and "densely" such that a surface covering which is very good for the shielding action can be ensured.

Examples of the invention will now be described with reference to the accompanying drawings in which:

FIG. 1 shows a plan view of an axial fan housing on the front or outflow side,

FIG. 2 shows a cross-section in the section plane II—II of FIG. 1,

FIG. 3 shows a greatly enlarged section A—A of FIG. 1,

FIG. 4 shows a correspondingly enlarged section B—B of FIG. 1,

FIG. 5 shows a section C—C of FIG. 1,

FIG. 6 shows a section D—D of FIG. 1 and

FIG. 7 shows an enlarged part view of region VII in FIG. 2 in an advantageous variant of the construction.

As shown in FIGS. 1 and 2, an axial fan housing 1—preferably constructed as a one-piece moulding, e.g. of diecast aluminium—comprises an accommodating part 2 for an axial fan, which is not shown, and a metallic shielding grating 4. The accommodating part 2 comprises an outer housing ring 6 and an inner holding part 8, to and on which the axial fan, which is not shown, can be fixed in a manner known per se. The housing ring 6 surrounds an air passage opening 10 which is substantially covered by the shielding grating 4. The housing ring 6 and the holding part 8 are joined to one another preferably in one piece via the shielding grating 4. As shown in FIG. 1, rectangular, in particular square, holding flanges 12 can also be provided.

The shielding grating 4 is thus constructed in the manner of an air-guiding wheel. The shielding grating 4 has a plurality of vane-like guide bars 14 which are arranged approximately radially as shown in FIG. 1. For reasons of a simplified and clear illustration, only some of the guide bars 14 are drawn in FIG. 1. As can be seen from FIGS. 2 to 5 in each case, the guide bars 14 each extend over a certain axial air-conducting length L, which in practice forms the thickness of the shielding grating 4.

The guide bars 14 are arranged in at least two and preferably as shown three, concentric circular series A, B and C. In each case separating bars 16 of cylindrical shape are arranged between the individual circular series A and B, and B and C. The guide bars 14 of the inner circular series A are thus joined on the inside to the holding part 8 and on the outside to one ot the separating bars 16. The guide bars 14 of the second or middle circular series B are held between two separating bars 16. The guide bars 14 of the outer circular series C are joined on the inside to the corresponding separating bar 16 and on the outside on the side of the housing ring.

The number n of guide bars 14 in the particular outer of two adjacent circular series is greater than that in the adjacent inner circular series. In FIG. 1, the number of guide bars 14 of the inner circular series A is designated $n_1$, the number in the middle circular series B is $n_2$ and that in the outer circular series is $n_3$. In this case, $n_1 < n_2 < n_3$. Depending on the particular radius or circumference of the individual circular series A, B and C and on the particular number n of guide bars 14, the guide bars 14 in each circular series are spaced apart from one another by a certain circumferential angular separation $\alpha$ (in each case measured at the radially inner end of the guide bars). The illustrated arrangement is preferred in which the circumferential angular separation decreases from circular series to circular series from the inside outwards, i.e. $\alpha_1 > \alpha_2 > \alpha_3$.

As can be seen from FIG. 1, each guide bar 14—with respect to its longitudinal extension between its radially inner and outer connecting points—is aligned at an angle to the particular radial direction such that it does not extend parallel to the approximately radially running rear edge of the vanes of the fan wheel, which is advantageous for favourable noise properties. For this purpose, the outer connecting point is displaced with respect to the radial direction, in particular against the direction of rotation (arrow direction 18 in FIG. 1) of the axial fan. As a result, each guide bar 14 encloses an angle of inclination $\beta$ with the radial direction, this angle of inclination preferably becoming smaller from circular series to circular series from the inside outwards, i.e. $\beta_1 > \beta_2 > \beta_3$.

As can be seen from FIGS. 3 to 5, each guide bar 14—substantially corresponding to the direction of the angular momentum of the air—encloses a guiding angle $\gamma$ with the axial direction in respect of its axial extension over the air-conducting length (L), and in particular such that each guide bar 14—starting from the inflow side 20 facing the axial fan—runs at an angle, corresponding to the direction of rotation (arrow 18 in FIG. 1), to the opposite outflow side 22. It is expediently envisaged here to set the guiding angle ($\gamma$) for the individual guide bars 14 such that for each guide bar 14, it substantially corresponds to the flow direction, existing in the particular cross-sectional region, of the air—which in principle flows in with a certain angular momentum on the basis of the axial fan principle.

This advantageous feature above all contributes towards a considerable reduction in the evolution of noise, in that burbling at the guide bars, which could occur if the air were to flow at a greater angle to the plane of the guide bars 14, is avoided.

Because of the flow properties of the axial fan, the arrangement of FIGS. 3 to 5 is advantageous where the guiding angle decreases from circular series to circular series from the inside outwards, i.e. $\gamma_1 > \gamma_2 > \gamma_3$.

As can furthermore be seen from FIGS. 3 to 5, each guide bar 14—because of its inclined position in the guiding angle $\gamma$—has an upper side 24 facing the inflow side 20 and an underside 26 facing the outflow side 22. For good air conduction, it is advantageous here to construct the upper sides 24 in each case with a convex curvature—in particular in the form of a circular arc with a radius of curvature R—from the inflow side 20 to the outflow side 22. This radius of curvature R is in each case chosen such that a tangent applied in the region of the inflow side 20 substantially corresponds to the particular guiding angle $\gamma$, while a tangent applied at the opposite outflow side 22 on the upper side 24 substantially corresponds to the axial direction. In this manner, good air conduction or air deflection—corresponding to the broken arrows drawn in FIGS. 3 to 5—in the axial direction is achieved. Here also, it is preferably envisaged to design the radii of curvature R of the upper sides 24 differently from circular series to circular series; in particular, the radius of curvature increases from the inside outwards, i.e. $R_1 <_{R2} <_{R3}$. In this construction, the curvature itself is more pronounced on the inside (FIG. 3) than on the outside (FIG. 5).

FIGS. 3 to 5 also show the preferred construction of the underside 26 of each guide bar 14 which is flat. However, a concave or convex curvature also lies within the scope of the invention.

A cable bridge 30 (FIGS. 1 and 6), which serves as a guide for the electrical connecting leads of the fan (which leads are not shown), also extends between the housing ring 6 and the inner holding section 8 over the region of the guide bars 14.

For this purpose, the cable bridge 30 is constructed with a U-shaped cross-section, so that it forms an accommodating conduit 32 for the leads. As seen in FIG. 1, the cable bridge 30 runs substantially tangentially to the central circular fan-holding section 8, with its outer region displaced with respect to the radial direction against the direction of rotation 18. The cable bridge 30—like the guide bars 14—thus also does not run parallel to the approximately radially aligned rear edges of the vanes of the fan wheel, which is advantageous in respect of the noise properties.

As seen in FIG. 2, all the components lie with their surfaces or edges facing the outflow side 22 in one and the same plane, as a result of which the housing 1 is practically "smooth-surfaced" on the outflow side, apart from the openings formed between the guide bars 14.

As seen in FIGS. 3 to 5, each guide bar 14 is rounded off with a certain radius in the region of its edge facing the inflow side 20. The opposite edge on the outflow side has a low bar thickness. Overall, a type of supporting surface profile results on the guide bars 14.

As seen in FIG. 2, the circular separating bars 16 have sharp-edged or flat, rectangular end edges on their two axial sides. However, instead of this, in each case a rounded-off ring edge 34 can be provided at least on the inflow side 20 facing the fan, which is of advantage for the flow properties. This preferred embodiment is illustrated separately in FIG. 7.

A typical housing 1 has the following dimensions:

| Dimension | innermost circular series A | middle circular series B | outer circular series C |
|---|---|---|---|
| Number n of guide bars 14 | $n_1 = 13$ | $n_2 = 19$ | $n_3 = 29$ |
| Circumferential angular separation $\alpha$ of the guide bars (at the particular inner connection) | $\alpha_1 = 25°$ | $\alpha_2 = 18°$ | $\alpha_3 = 12°$ |
| Angle of inclination $\beta$ (angular inclination to the radial direction) | $\beta_1 = 54°$ | $\beta_2 = 33°$ | $\beta_3 = 25°$ |
| Guide angle $\gamma$ (angular inclination to the axial direction) | $\gamma_1 = 25°$ | $\gamma_2 = 22°$ | $\gamma_3 = 18°$ |
| Radius of curvature of the profile upper side R | $R_1 = 14$ mm | $R_2 = 17$ mm | $R_3 = 20$ mm |
| Ø inside | 47 mm | 70 mm | 92.5 mm |
| Ø outside | 68.5 mm | 91 mm | 115 mm |

The air-conducting length L here is about 10 mm. The overall length of the housing ring 6 is approx. 38 mm.

I claim:

1. An axial fan housing comprising:

an accommodating part which has an air passage opening for an axial fan and a metallic shielding grating which covers the air passage opening;

the shielding grating being constructed in the manner of an air-guiding wheel with vane-like guide bar which extend over a certain axial air-conducting length and are substantially arranged substantially radially;

the guide bars being arranged in distribution in at least two concentric circular series and the number of guide bars in the outer circular series being greater than that in the adjacent inner circular series; and each guide bar, with respect to its longitudinal extension between its radially inner and outer connecting points, forming an angle of inclination with the radial direction such that the outer connecting point is displaced with respect to the radial direction.

2. An axial fan housing as claimed in claim 1 wherein the angle of inclination of each circular series decreases from the inside outwards.

3. An axial fan housing as claimed in claim 1, wherein the accommodating part is constructed as a one-piece molding with the housing ring and fan-holding section and the shielding grating.

4. An axial fan housing as in claim 3, wherein the accommodating part is of diecast aluminum.

5. An axial fan housing as claimed in claim 1, wherein the connecting point is displaced against the direction of rotation of the radial fan.

6. An axial fan housing comprising:

an accommodating part which has an air passage opening for an axial fan and a metallic shielding grating which covers the air passage opening;

the shielding grating being constructed in the manner of an air-guiding wheel with vane-like guide bars which extend over a certain axial air-conducting length and are substantially arranged substantially radially;

the guide bars being arranged in distribution in at least two concentric circular series and the number of guide bars in the outer circular series being greater than that in the adjacent inner circular series;

each guide bar, with respect to its axial extension over the air-conducting length, forming a guiding angle with the axial direction such that each guide bar, starting from the inflow side facing the axial fan, runs at an angle, corresponding to the direction of rotation, to the opposite outflow side; and the guiding angle of each circular series decreasing from the inside outwards.

7. An axial fan housing comprising:

an accommodating part which has an air passage opening for an axial fan and a metallic shielding grating which covers the air passage opening;

the shielding grating being constructed in the manner of an air-guiding wheel with vane-like guide bars which extend over a certain axial air-conducting length and are substantially arranged substantially radially;

the guide bars being arranged in distribution in at least two concentric circular series and the number of guide bars in the outer circular series being greater than that in the adjacent inner circular series;

each guide bar having an upper side facing the inflow side and an underside facing the outflow side, the upper side having a convex curvature from the inflow side to the outflow side;

the convex curvature being a circular arc; and the radius of curvature of each circular series increasing from the inside outwards.

8. An axial fan housing comprising:

an accommodating part which has an air passage opening for an axial fan and a metallic shielding grating which covers the air passage opening;

the shielding grating being constructed in the manner of an air-guiding wheel with vane-like guide bars which extend over a certain axial air-conducting length and are substantially arranged substantially radially;

the guide bars being arranged in distribution in at least two concentric circular series and the number of guide bars in the outer circular series being greater than that in the adjacent inner circular series;

each guide bar, with respect to its axial extension over the air-conducting length, forming a guiding angle with the axial direction such that each guide bar, starting from the inflow side facing the axial fan, runs at an angle, corresponding to the direction of rotation, to the opposite outflow side; and the underside of each guide bar being substantially flat in construction.

9. An axial fan housing comprising:

an accommodating part which has an air passage opening for an axial fan and a metallic shielding grating which covers the air passage opening;

the shielding grating being constructed in the manner of an air-guiding wheel with vane-like guide bars which extend over a certain axial air-conducting length and are substantially arranged substantially radially;

the guide bars being arranged in distribution in at least two concentric circular series and the number of guide bars in the outer circular series being greater than that in the adjacent inner circular series;

the guide bars being arranged in distribution in three concentric circular series, the number of guide bars in each circular series increasing from the inside outwards; and a cable bridge running between an outer housing ring and an inner fan-holding section over the region of the guide bars, substantially tangential to the central circular fan-holding section.

10. A housing as claimed in claim 9 wherein the outer region of the holding section is displaced with respect to the radial direction against the direction of rotation.

* * * * *